United States Patent [19]
Lane

[11] Patent Number: 6,005,756
[45] Date of Patent: Dec. 21, 1999

[54] EFFECTIVE GROUNDING OF A CIRCUIT AT RF AND IF

[75] Inventor: Mark Lane, San Diego, Calif.

[73] Assignee: Uniden San Diego Research & Development Center, Inc.

[21] Appl. No.: 08/977,785

[22] Filed: Nov. 25, 1997

[51] Int. Cl.[6] .................................................. H02H 3/00
[52] U.S. Cl. .............................. 361/42; 361/58; 361/113; 361/119
[58] Field of Search .............................. 361/58, 113, 119, 361/42, 120

[56] References Cited

U.S. PATENT DOCUMENTS 4,380,828  4/1983  Moon ...................................... 455/319

OTHER PUBLICATIONS

Motorola RF Device Data, Thrid Edition, Motorola Inc. 1983; pp. 4–491 (MRF644), 4–495 (MRF646) and 4–515 (MRF752).

*Primary Examiner*—Stephen W Jackson
*Attorney, Agent, or Firm*—Cooley Godward LLP

[57] ABSTRACT

A circuit for grounding a signal at a first frequency and at a second frequency. The circuit includes a first capacitor and an inductor in series and a second capacitor in parallel with the first capacitor and inductor. The first capacitor is series resonant at the first frequency and the second capacitor is series resonant at the second frequency. The inductance of the inductor is selected so the combination of the packaging inductance of the first capacitor and the inductor parallel resonants with the second capacitor at a frequency lower than the second frequency and higher than the first frequency, where the second frequency is greater than the first frequency. The grounding circuit may be used to provide a second input to a balanced RF mixer where the RF mixer receives a RF signal at the second frequency at a first input and generates an IF signal at the first frequency.

19 Claims, 1 Drawing Sheet

EFFECTIVE GROUNDING OF A CIRCUIT AT RF AND IF

BACKGROUND OF THE INVENTION

1. Field of the Invention

This invention relates to a circuit for grounding at multiple frequencies, more particularly, to a circuit for grounding at IF and at RF.

2. Description of the Related Art

Balanced mixers are employed to frequency shift a first signal at a first frequency to a second frequency. These mixers have a balanced set of inputs and a balanced set of outputs. In some applications employing a balanced mixer, only the first signal at the first frequency is available as an input signal. This input signal is provided to a first input of the balanced set of inputs for the mixer. In such applications, the second input of the set of balanced inputs is grounded to provide a balanced set of input signals. Commonly, the second input of the balanced set of inputs is grounded at the first and second frequencies of the mixer but not at DC. The second input of the balanced set of inputs is connected to a circuit having a first and second capacitor in parallel. In this circuit, one of the first and second capacitors is series resonant at the first frequency and the other capacitor is series resonant at the second frequency.

An example of a balanced mixer is a balanced Radio Frequency (RF) mixer. The RF mixer may frequency shift a Radio Frequency signal from a RF to an Intermediate Frequency where the RF signal is received from an antenna. As described above, one of the balanced set of input signals for the RF mixer is grounded at IF and RF. As also described above, the circuit used to ground this input includes a first capacitor in parallel with a second capacitor. The first capacitor is series resonant at IF and the second capacitor is series resonant at RF. In some implementations, the packaging of the first capacitor has a parasitic inductance at RF. In such an implementation, the first capacitor is effectively an inductor at RF. The first capacitor thus forms a parallel tuned circuit with the second capacitor at RF that increases the impedance to ground of the overall circuit.

This reduces the balance of the set of input signals and thus the gain of the output of the mixer. Thus, a need exists for a circuit that effectively grounds a signal at a first and a second frequency without inducing significant inductance at the higher of the first and second frequencies.

SUMMARY OF THE INVENTION

In one aspect, the invention relates to a grounding circuit that grounds a signal at a first frequency and at a second frequency where the second frequency is greater than the first frequency. The grounding circuit includes a first capacitor in parallel with a second capacitor. The first capacitor for grounding the signal at the first frequency and the second capacitor for grounding the signal at the second frequency. To reduce the effect of the packaging inductance of the first capacitor at the second frequency, an inductor is placed in series with the first capacitor. The inductance of the inductor is selected so that the series combination of the first capacitor and the inductor is inductive at a frequency lower than the second frequency. The parallel combination of the first capacitor and the inductor and the second capacitor forms a parallel circuit resonant at a frequency that lies above the first frequency and below the second frequency, preferably approximately midway between the first and second frequencies. In one embodiment, the second frequency is a Radio Frequency and the first frequency is an Intermediate Frequency.

The invention also includes a mixer circuit for generating a first signal at a first frequency from a second signal at a second frequency where the second frequency is greater than the first frequency. The circuit includes a mixer having at least a first and second input port where the first input port receives the second signal. The mixer circuit also includes a grounding circuit that is coupled to the second input port of the mixer. The grounding circuit includes a first capacitor that is series resonant at the first frequency and an inductor in series with the first capacitor. The grounding circuit also includes a second capacitor in parallel with the first capacitor and the inductor. The second capacitor is series resonant at the second frequency. The grounding circuit grounds the second signal at the second frequency and at the first frequency.

As for the grounding circuit described above, the inductor is placed in series with the first capacitor to reduce the effect of the packaging inductance of the first capacitor at the second frequency. The inductance of the inductor is selected so that the series combination of the first capacitor and the inductor is inductive at a frequency lower than the second frequency. Preferably, the inductance of the inductor is selected so that the parallel combination of the first capacitor and the inductor and the second capacitor forms a parallel circuit resonant at a frequency that lies above the first frequency and below the second frequency, preferably approximately midway between the first and second frequencies. In one embodiment, the second frequency is a Radio Frequency (RF), the first frequency is an Intermediate Frequency (IF), the first signal is an IF signal, and the second signal is an RF signal.

In another aspect, the invention relates to a Radio Frequency (RF) mixer circuit that generates an intermediate Frequency (IF) signal at a IF from an RF signal at an RF. The RF mixer circuit includes a balanced RF mixer. The balanced RF mixer has a first and second balanced input port and a first and second balanced output port. The first input port receives the RF signal. The mixer generates the IF signal at the IF and provides the IF signal at the first and second balanced output ports. The RF mixer also includes a grounding circuit that is coupled to the second input port of the RF mixer. The grounding circuit includes a first capacitor that is series resonant at the IF and an inductor in series with the first capacitor. The grounding circuit also includes a second capacitor in parallel with the first capacitor and the inductor where the second capacitor is series resonant at the RF.

The grounding circuit grounds the RF signal at the RF and at the IF. The inductor is placed in series with the first capacitor to reduce the effect of the packaging inductance of the first capacitor at the RF. The inductance of the inductor is selected so that the series combination of the first capacitor and the inductor is inductive at a frequency lower than the RF. The inductance of the inductor is selected so that the series combination of the first capacitor and the inductor is inductive at a frequency lower than the second frequency. Preferably, the inductance of the inductor is selected so that the parallel combination of the first capacitor and the inductor and the second capacitor forms a parallel circuit resonant at a frequency that lies above the IF and below the RF, preferably approximately midway between the IF and RF frequencies.

In yet another aspect, the invention relates to a RF receiver system. The system further includes an antenna that receives an RF signal. The antenna is coupled to a low noise amplifier (LNA). The LNA receives the RF signal from the antenna and generates an amplified RF signal that is provided to the first balanced input port of the RF mixer. In a preferred embodiment of the invention, the RF is around 900 MHz and the IF is around 70 MHz

DETAILED DESCRIPTION OF THE PREFERRED EMBODIMENTS

Figure 1:
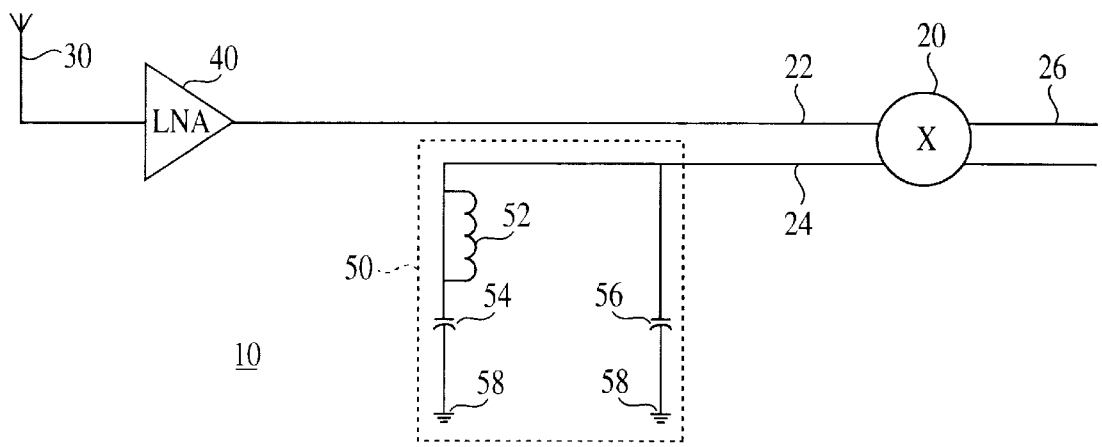
FIG. 1 is a diagram of a RF receiver system according to a preferred embodiment of the invention.

A preferred embodiment of a RF receiver system 10 according to the present invention is presented with reference to FIG. 1. The RF receiver system 10 includes an antenna 30, LNA 40, RF mixer 20, and grounding circuit 50. In basic operation, a RF signal is received by antenna 30, amplified by LNA 40, and frequency shifted by RF mixer 20. RF Mixer 20 requires a balanced set of input signals 22, 24 to generate a balanced intermediate frequency (IF) signal 26. The received RF signal received by antenna 30 and amplified by LNA 40, however, is a single unbalanced RF signal 22. In order to provide a second balancing signal 24 for mixer 20, grounding circuit 50 is coupled to the second input of the balanced set of inputs for RF mixer 20 to generate the second input signal 24.

In a preferred embodiment of the invention, grounding circuit 50 includes a RF capacitor 56 in parallel with an IF capacitor 54 in series with an inductor 52. Both the RF capacitor 56 and IF capacitor 54 are grounded 58. RF capacitor 56 is selected to be series resonant around the RF of RF signal 22. IF capacitor 54 is selected to be series resonant around the IF of IF signal 26. In this embodiment, the packaging of IF capacitor 54 is also inductive about the RF of RF signal 22. This inductance, by itself, may increase the impedance of the grounding circuit 50. In order to change the effective frequency of inductance of the packaging of IF capacitor 54, inductor 52 is placed in series with IF capacitor 54 in grounding circuit 50. The inductance of inductor 52 is selected so the combination of the inductance of IF capacitor 54 and inductor 52 parallel resonates with capacitor 56 at a frequency greater than the IF of IF signal 26 and lower than the RF of RF signal 22.

This reduces the impedance of grounding circuit 50 at the RF of RF signal 22. In the preferred embodiment of the invention, the inductance of inductor 52 is selected so that the combination of capacitor 54 and inductor 52 in parallel with capacitor 56 forms a circuit that resonants at a frequency approximately midway between the IF of IF signal 26 and RF of RF signal 22. In an exemplary embodiment of the invention, the RF of RF signal 22 is around 900 MHz and the IF of IF signal 26 is around 70 MHz. In addition, RF capacitor 56 is about a 2.2 pF-capacitor and IF capacitor 54 is about a 470 pF capacitor. Finally, inductor 52 is about a 27 nH inductor.

Other variations within the scope of the appended claims are possible. For example, inductor 52 is ideally calculated to be a 22 nH inductor for the above presented exemplary system, however, 27 nH inductors are more readily available and, thus employed in the exemplary embodiment.

I claim:

1. A grounding circuit for grounding a signal at a first and at a second frequency, the second frequency being greater than the first frequency, of the type including a first capacitor in parallel with a second capacitor, the first capacitor for grounding at the first frequency and the second capacitor for grounding at the second frequency, the improvement comprising an inductor in series with the first capacitor wherein the inductance of the inductor is selected such that the series combination of the inductor and the first capacitor is inductive at a frequency having a predefined relationship to the second frequency and wherein the first capacitor is inductive at the second frequency.

2. The grounding circuit of claim 1, wherein the inductance of the inductor is selected so that the series combination of the first capacitor and the inductor is inductive at a frequency lower than the second frequency.

3. The grounding circuit of claim 1, wherein the inductance of the inductor is selected so that the series combination of the first capacitor and the inductor parallel resonates with the second capacitor at a frequency between the first frequency and the second frequency.

4. The grounding circuit of claim 1, wherein the inductance of the inductor is selected so that the series combination of the first capacitor and the inductor parallel resonates with the second capacitor at a frequency approximately midway between the first frequency and the second frequency.

5. The grounding circuit of claim 4, wherein the second frequency is a Radio Frequency and the first frequency is an Intermediate Frequency.

6. A grounding circuit for grounding a signal at a first and at a second frequency, the second frequency being greater than the first frequency, the circuit comprising:

a first capacitor, the first capacitor for grounding at the first frequency wherein the first capacitor is series resonant at the first frequency;

an inductor in series with the first capacitor wherein the inductance of the inductor is selected such that the series combination of the inductor and the first capacitor is inductive at a frequency having a predefined relationship to the second frequency; and a second capacitor in parallel with the first capacitor and the inductor, the second capacitor for grounding at the second frequency wherein the second capacitor is series resonant at the second frequency.

7. The grounding circuit of claim 6, wherein the first capacitor is inductive at the second frequency.

8. The grounding circuit of claim 7, wherein the inductance of the inductor is selected so that the series combination of the first capacitor and the inductor is inductive at a frequency lower than the second frequency.

9. The grounding circuit of claim 7, wherein the inductance of the inductor is selected so that the series combination of the first capacitor and the inductor parallel resonates with the second capacitor at a frequency between the first frequency and the second frequency.

10. The grounding circuit of claim 7, wherein the inductance of the inductor is selected so that the series combination of the first capacitor and the inductor parallel resonates with the second capacitor at a frequency approximately midway between the first frequency and the second frequency.

11. A mixer circuit for generating a first signal at a first frequency from a second signal at a second frequency, the second frequency being greater than the first frequency, the circuit comprising:

a mixer, the mixer having at least a first and a second input port and at least one output port, the first input port receiving the second signal and the mixer generating the first signal at the first frequency and providing the first signal at the at least one output port;

a grounding circuit coupled to the second input port of the mixer, the grounding circuit comprising:

a first capacitor, the first capacitor series resonant at the first frequency;

an inductor in series with the first capacitor; and a second capacitor in parallel with the first capacitor and the inductor, the second capacitor series resonant at the second frequency, wherein the grounding circuit grounds at the second frequency and at the first frequency.

12. The mixer circuit of claim 11, wherein the first capacitor is inductive at the second frequency.

13. A Radio Frequency (RF) mixer circuit for generating an intermediate Frequency (IF) signal at a IF from an RF signal at an RF, the circuit comprising:

a balanced RF mixer, the mixer having a first and a second balanced input port and a first and a second balanced output port, the first input port receiving the RF signal and the mixer generating the IF signal at the IF and providing the IF signal at the first and second balanced output ports;

a grounding circuit coupled to the second input port of the RF mixer, the grounding circuit comprising:

a first capacitor, the first capacitor series resonant at the IF;

an inductor in series with the first capacitor; and a second capacitor in parallel with the first capacitor and the inductor, the second capacitor series resonant at the RF, wherein the grounding circuit grounds at the RF and at the IF.

14. The RF mixer circuit of claim 13, wherein the first capacitor is inductive at the RF.

15. The RF mixer circuit of claim 14, wherein the inductance of the inductor is selected so that the series combination of the first capacitor and the inductor is inductive at a frequency lower than the RF.

16. The RF mixer circuit of claim 15, wherein the inductance of the inductor is selected so that the series combination of the first capacitor and the inductor parallel resonates with the second capacitor at a frequency between the IF and the RF.

17. The RF mixer circuit of claim 15, wherein the inductance of the inductor is selected so that the series combination of the first capacitor and the inductor parallel resonates with the second capacitor at a frequency approximately midway between the IF and the RF.

18. A grounding circuit for grounding a signal at a first and at a second frequency, the second frequency being greater than the first frequency, the circuit comprising:

a first capacitor, the first capacitor for grounding at the first frequency wherein the first capacitor has a parasitic inductance associated therewith;

an inductor in series with the first capacitor wherein the inductance of the inductor is selected such that the series combination of the inductor and the first capacitor is inductive at a predefined frequency; and a second capacitor in parallel with the first capacitor and the inductor, the second capacitor for grounding at the second frequency wherein the first capacitor, second capacitor and inductor form a parallel tuned circuit to compensate for said parasitic inductance.

19. The grounding circuit of claim 14, wherein the inductance of the inductor is selected so that the series combination of the first capacitor and the inductor is inductive at a frequency lower than the second frequency.

* * * * *